United States Patent [19]

Horton et al.

[11] Patent Number: 5,089,958
[45] Date of Patent: Feb. 18, 1992

[54] FAULT TOLERANT COMPUTER BACKUP SYSTEM

[75] Inventors: James A. Horton, Bethlehem; Stephen M. Getz, Pittsburgh, both of Pa.

[73] Assignee: Vortex Systems, Inc., Pittsburgh, Pa.

[21] Appl. No.: 300,469

[22] Filed: Jan. 23, 1989

[51] Int. Cl.$^5$ .............................................. G06F 11/16
[52] U.S. Cl. ........................... 395/575; 364/256.3; 364/268.5; 364/269.2; 364/285.1; 364/DIG. 1; 371/10.1
[58] Field of Search ............... 364/200, 232.1, 256.3, 364/256.4, 256.6, 268.5, 269.2, 285.1; 371/10.1

[56] References Cited

U.S. PATENT DOCUMENTS

| | | | |
|---|---|---|---|
| 3,444,528 | 11/1966 | Lovell et al. | 340/172.5 |
| 3,533,082 | 10/1970 | Schnabel et al. | 364/200 |
| 4,141,066 | 2/1979 | Keiles | 364/119 |
| 4,156,907 | 5/1979 | Rawlings et al. | 364/200 |
| 4,164,017 | 8/1979 | Randell et al. | 364/200 |
| 4,191,996 | 3/1980 | Chesley | 371/9.1 |
| 4,351,023 | 9/1982 | Richer | 364/187 |
| 4,378,588 | 3/1983 | Katzmann et al. | 364/200 |
| 4,403,303 | 9/1983 | Howes et al. | 364/900 |
| 4,453,215 | 6/1984 | Reid | 364/200 |
| 4,459,658 | 7/1984 | Gabbe et al. | 364/200 |
| 4,479,214 | 10/1984 | Ryan | 371/2.2 |
| 4,483,001 | 11/1984 | Ryan | 371/2.2 |
| 4,484,275 | 11/1984 | Katzman et al. | 364/200 |
| 4,486,826 | 12/1984 | Wolff et al. | 364/200 |
| 4,498,145 | 2/1985 | Baker et al. | 364/900 |
| 4,507,751 | 3/1985 | Gawlick et al. | 364/900 |
| 4,521,847 | 6/1985 | Ziehm et al. | 364/184 |
| 4,581,701 | 4/1986 | Hess et al. | 364/187 |
| 4,607,365 | 8/1986 | Greig et al. | 371/16.2 |
| 4,608,688 | 8/1986 | Hansen et al. | 371/11 |
| 4,639,856 | 1/1987 | Hrustich et al. | 364/200 |
| 4,648,031 | 3/1987 | Jenner | 364/200 |
| 4,652,940 | 3/1987 | Sumiyoshi | 360/5 |
| 4,654,819 | 3/1987 | Stiffler et al. | 364/900 |
| 4,654,857 | 3/1987 | Samson et al. | 371/9.1 |
| 4,674,038 | 6/1987 | Brelsford et al. | 364/200 |
| 4,703,421 | 10/1987 | Abrant et al. | 364/200 |
| 4,703,481 | 10/1987 | Fremont | 371/12 |
| 4,713,811 | 12/1987 | Frey | 371/8.2 |
| 4,727,516 | 2/1988 | Yoshida et al. | 365/200 |
| 4,736,339 | 4/1988 | Crabbe, Jr. | 364/200 |
| 4,750,177 | 6/1988 | Hendrie et al. | 371/32 |
| 4,754,397 | 6/1988 | Varaiya et al. | 364/200 |
| 4,878,167 | 10/1989 | Kapulka et al. | 364/200 |

Primary Examiner—Charles E. Atkinson
Attorney, Agent, or Firm—Buchanan Ingersoll; Lynn J. Alstadt

[57] ABSTRACT

A method and apparatus for storing and retrieving any prior state of a computer system is provided. Upon installation of the system, a base image corresponding to the initial state of the computer system is established and stored on a storage device. The system monitors changes to the state of the host and subsequently stores at least some of these changes on the storage device. These changes are then mapped by location of the stored changes in an address table to enable subsequent retrieval of any selected changes. When the address table becomes full, at least one differential image of the state of the system is subsequently created by compiling all changes to the base image which occurred between creation of the base image and the selected time. A virtual image may thus be created of data stored on the storage device, as such data existed at a predetermined prior point in time, from which data and files may be retrieved and written to the host disk.

19 Claims, 13 Drawing Sheets

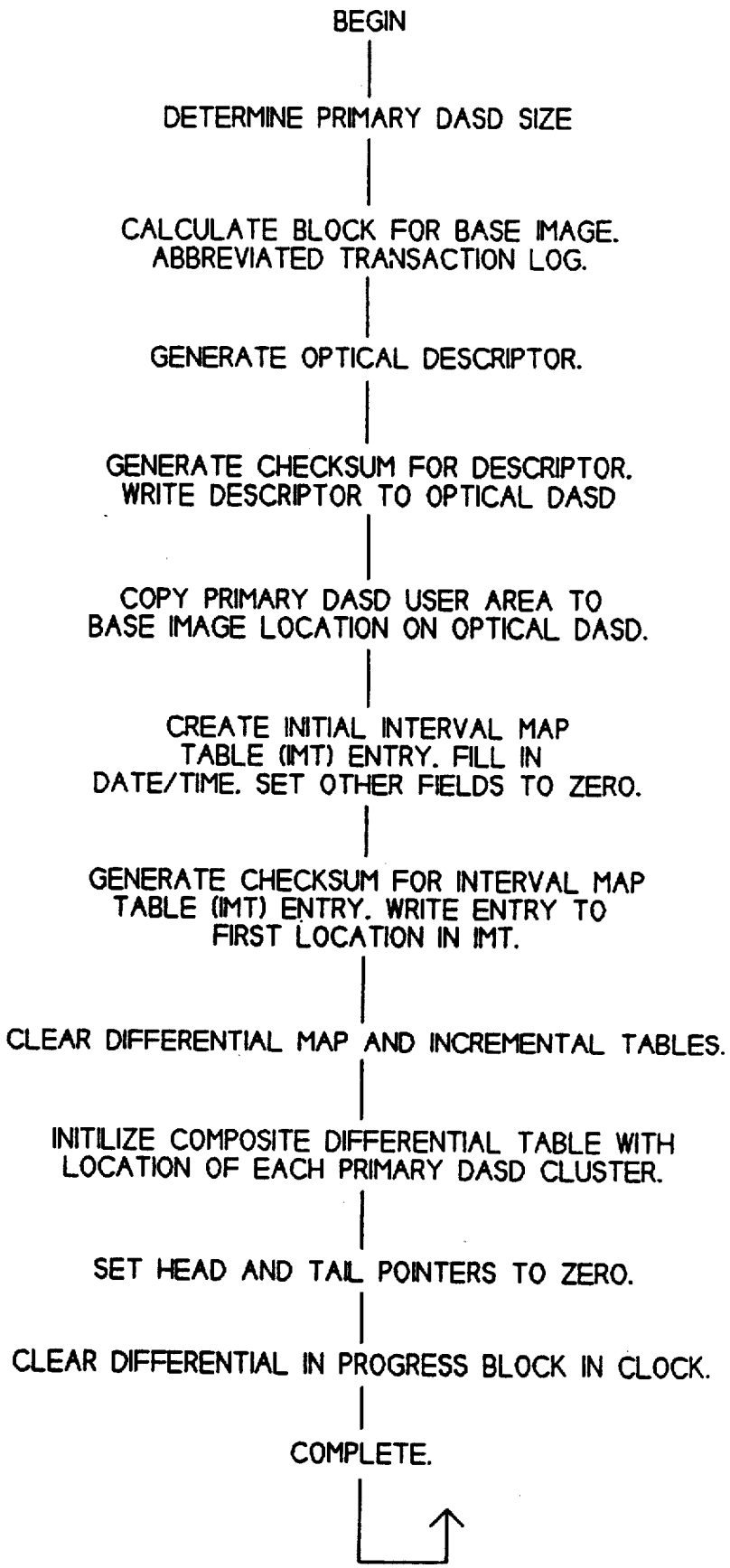

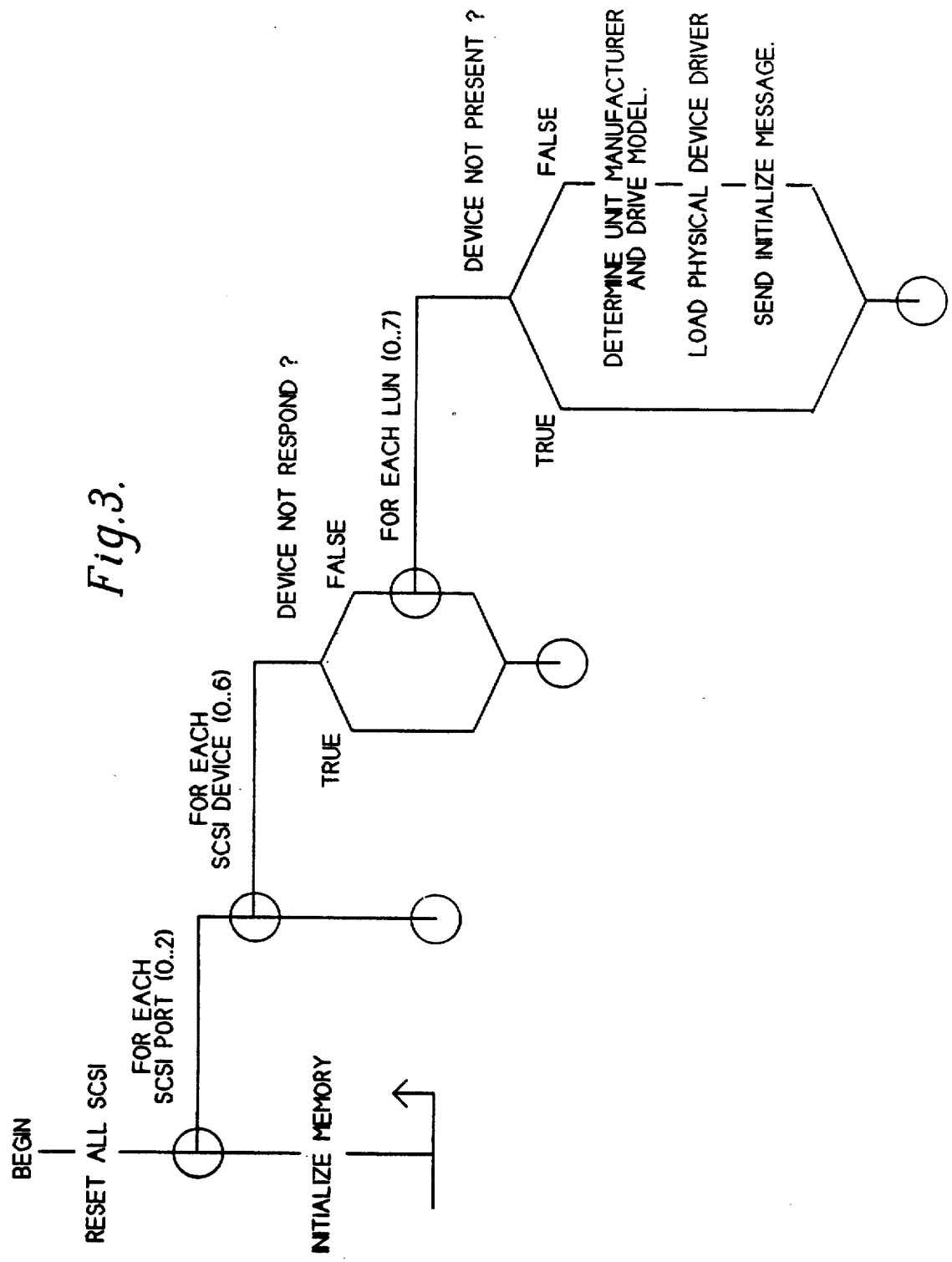

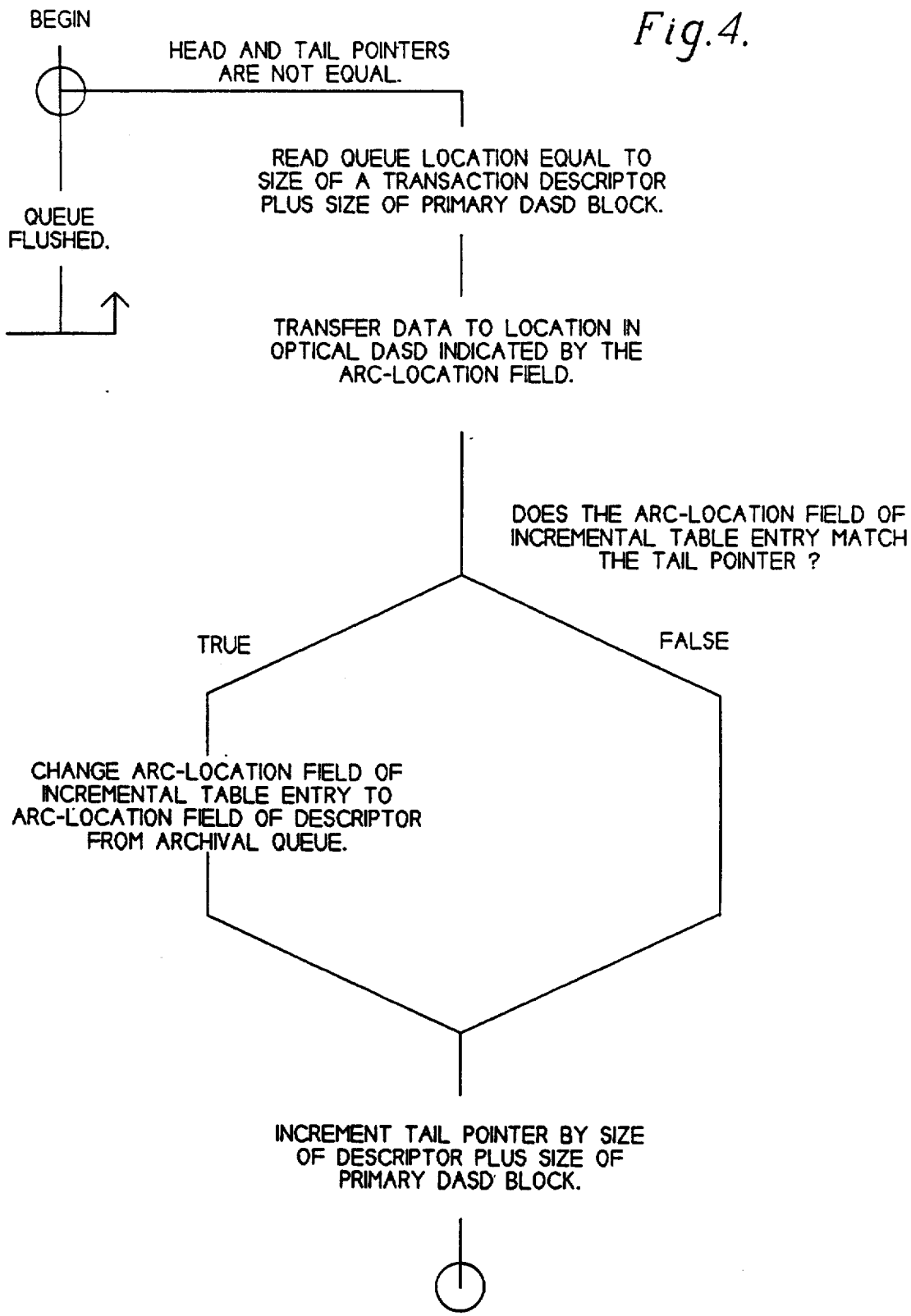

BEGIN
|
LOCATE LAST VALID ENTRY
IN INTERVAL MAP
|
LOCATE LAST VALID
ABBREVIATED TRANSACTION
IN ABBREVIATED TRANSACTION LOG.
|
USE O-LOCATION FIELD OF
ABBREVIATED DESCRIPTOR PLUS
SIZE OF DESCRIPTOR.
PLUS SIZE OF BLOCK OF PRIMARY DASD
AS INITIAL VALUE.
|

*Fig.5.*

  WHILE DESCRIPTOR OPTICAL
INDEX IS VALID.

ABBREVIATED TRANSACTION LOG
CLEANUP IS COMPLETE.

ADD SIZE OF DESCRIPTOR PLUS
SIZE OF BLOCK OF PRIMARY DASD
TO OPTICAL INDEX.
|
APPEND DESCRIPTOR AT OPTICAL INDEX
TO END OF ABBREVIATED
TRANSACTION LOG.
|

Fig.9.

BEGIN

INSERT TRANSACTION FOR PRIMARY DASD
USING HEAD POINTER ARCHIVAL QUEUE AS
ARC-LOCATION FIELD.
AND SETTING MOST SIGNIFICANT BIT
OF ARC-LOCATION FIELD.

CREATE A TRANSACTION DESCRIPTOR USING
BLOCK OF PRIMARY DASD WRITTEN AS
P-BLOCK FIELD.
INCREMENTAL TABLE ENTRY NUMBER
AND NEXT FREE LOCATION IN
OPTICAL DASD AS O-LOCATION FIELD.

APPEND DESCRIPTOR TO
ABBREVIATED TRANSACTION LOG.

APPEND DESCRIPTOR AND PRIMARY DASD DATA
TO ARCHIVAL QUEUE.

TRANSFER DATA TO PRIMARY DASD.

Fig.12.

BEGIN

↓

CREATE AND INTERVAL ENTRY DESCRIPTOR.

↓

COPY CURRENT DIFFERENTIAL MAP
LOCATION IN OPTICAL DASD SPECIFIED BY
INTERVAL DESCRIPTOR.

↓

COPY DIFFERENTIAL MAP AND INITIATE
A DIFFERENTIAL IMAGE TO LOCATION IN
OPTICAL DASD INDICATED BY INTERVAL DESCRIPTOR.

↓

CLEAR ORIGINAL DIFFERENTIAL MAP TO
INDICATE NO CLUSTERS HAVE BEEN ALTERED.

↓

COPY CURRENT INCREMENTAL TABLE TO
LOCATION IN OPTICAL DASD SPECIFIED BY
INTERVAL DESCRIPTOR.

↓

CLEAR INCREMENTAL TABLE AND ENTRY POINTS TABLE
TO INDICATE NO INCREMENTAL TRANSACTIONS.

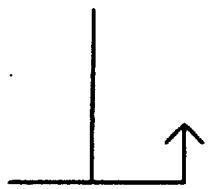

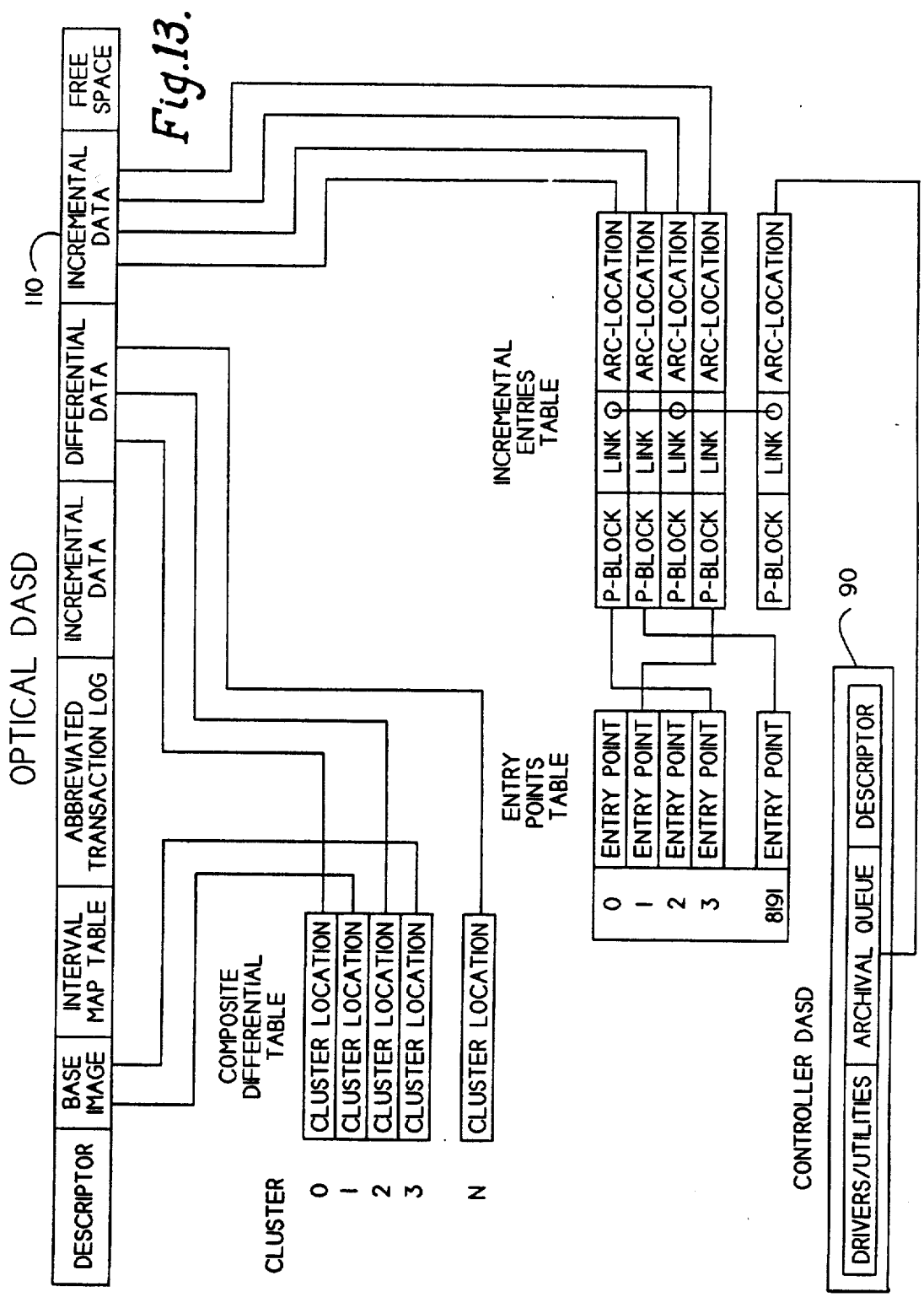

FAULT TOLERANT COMPUTER BACKUP SYSTEM

BACKGROUND OF THE INVENTION

1. Field of the Invention

The present invention relates to a system for maintaining a backup for a computer disk drive in the event of failure, for the prevention of data loss. More specifically, the invention relates to a method and apparatus for enabling the user to restore either a file or the entire contents of a disk, as they existed on that disk at any prior point in time by creating a virtual copy of the disk at that point in time.

2. Description of the Prior Art

Computers have become an integral part of both business and personal life. Each day, countless transactions are made either utilizing computers or being completely controlled by them. While today's computers are faster and more efficient than prior methods of recordkeeping and data transfer, older techniques employing paper records had one distinct advantage: backup in the case of lost data. Duplicate records could be stored in any one of a number of places, and in various forms. Similarly, if the equipment or personnel creating, reading or interpreting the data were to fail or be unable to complete a task, continuation of the task was easily accomplished by transferring the past work to substitute machines or people. This is not always possible with an electronic computing device.

One particular difficulty with computers is the storage medium. The vast majority of data utilized in conjunction with computers is stored on magnetic media. While great care is taken to insure the accuracy of this media, some flaws may be present. Additionally, continued use of such media leads to faults or other malfunctions related to the electromechanical methods of reading and writing data to these data storage devices.

A second difficulty, closely related to the first, is the inability to recover lost data, once a fault has occurred. When utilizing paper records, the older versions of a document, for example, could always be retrieved. This is not the case with magnetic media if: (1) the data has been over-written on a disk, or (2) the disk is inaccessible due to physical faults. Additionally, a general shortcoming of prior art backup systems is that backups are only kept for a short period of time. The physical space required to keep a constant stream of new backup disks or tapes would soon outgrow even the largest storage facility. This limitation thus dictates the re-use of backup media, and the continuous trail of past data is gone.

Prior inventors have proposed several solutions to this problem, both from a hardware and software vantage point. While many of the devices are concerned with failure of an electronic component, i.e., the processing device or the volatile memory, rather than the more permanent storage media, the techniques are analogous in most respects to permanent media. The solutions frequently posed in this area are the use of redundant components which may be utilized in the event of failure in a primary component. Transparent and immediate error detection and switchover means are therefore a primary adjunct focus in the utilization of these redundant devices. Redundant data backup is also well documented in the prior art, where the backup device contains a duplicate copy or "mirror" of the information utilized by or stored within the primary device. Frequently, however, no teaching is present for the restoration of data from the redundant device to the primary device once the primary device has come back "on line."

Redundant hardware components are disclosed in Grieg, et. al., U.S. Pat. No. 4,607,365, which teaches a system that will automatically select the secondary components as needed because of faults in the system. Similarly, Yoshida, et. al., U.S. Pat. No. 4,727,516, discloses a system having redundant memory arrays. If a defective memory cell is detected, a sister cell is utilized in its place. Redundant processors are disclosed in U.S. Pat. Nos. 4,484,275 and 4,378,588, issued to Katzman, et. al., which utilize the redundancy to insure that if a processor or data path is interrupted, secondary parallel processors are available to take the load.

Even a single chip may have redundant components to be utilized in the event of a failure of the primary systems as disclosed in Chesley, U.S. Pat. No. 4,191,996, which discloses such multiple processors and memory circuits.

Mirrored data, which is stored on an alternate device, is discussed in Varaiya, et. al., U.S. Pat. No. 4,754,397, which discloses a multiple disk drive apparatus which mirrors data storage operations to a disk, or "writes," to a number of disks. Should a disk fail, a redundant drive is selected. Richer, U.S. Pat. No. 4,351,023, discloses the use of redundant controllers in a similar manner. One controller serves in a primary role, the other as backup. In the event of a shutdown, the state of the first controller is transferred to the second, which has been "tracking" the functions of the first controller on a delayed basis. After restoration of the first controller, its primary status is resumed, and the data is transferred thereto. While the patent is not particularly explicit in reference to the data transfer from the second controller to the first, such a transfer appears necessary in light of the need for the state of the machine to be continued intact.

Hess, et. al., U.S. Pat. No. 4,581,701, discloses an apparatus which utilizes redundant hardware to provide a backup in the event of a failure. More importantly, however, the apparatus monitors and stores the status of the host through the use of a continuously updated memory buffer. Upon failure, the status, which is contained in the buffer, is transferred from one unit to another, permitting continued function without interruption.

Error detection to facilitate the automatic implementation of the secondary devices is also well developed. Hendrie, et. al., U.S. Pat. No. 4,750,177, Reid, U.S. Pat. No. 4,453,215, Samson, et. al., U.S Pat. No. 4,654,857, and Wolff, et. al., U.S. Pat. No. 4,486,826, all disclose a method and apparatus for detecting errors in a system and selecting secondary devices for replacement.

The most pertinent art, however, relates to the ability to store and retrieve a prior state or status of the machine after a failure. Ziehm, et. al., U.S. Pat. No. 4,521,847, discloses a system which permits the restoration of the state and status of a processing device from a non-volatile memory source. The state and status of the processor and memory are continually updated in the non-volatile memory area. After a power shutdown or other malfunction, the operating state of the host machine may be restored to its last prior state, through transfer of stored information from the non-volatile memory.

Others have taught that processing and memory functions ay be assumed, if the host's operation is halted, by a node of a network. Data may then be recovered from the node at a later time. Rawlings, et. al, U.S. Pat. No. 4,156,907, discloses a data communications subsystem which provides that in the event of a shutdown, both processing and memory functions are transferred from the host to each of several nodes. This information may then be uploaded back to the host after restoration of service.

The primary focus of most of the prior art is thus the use of redundant components for utilization during a failure of the host, or the restoration of the prior state of the system after the first components are replaced. A secondary focus is error detection and implementation of such a redundant system thereafter.

There is thus a need for a device which will enable the user to not only keep a constant backup of a data storage device, such as a magnetic disk, but also keep the backup in the form of a readily retrievable continuous record of the state of that storage device.

A secondary ability not found in the prior art is the physical replacement of a faulty device and the replacement of data on the substitute without halting the system. In a network system especially, where many users share the data storage space, the loss of a physical device means more than just lost data—there is a considerable cost in "downtime" as the unit is repaired or replaced. No system is known which enables the rapid and easy replacement of physical devices while maintaining a portion of the functionality of the network.

SUMMARY OF THE INVENTION

A method and apparatus for storing and retrieving any prior state of a computer system in which data is transferred, and such transfer changes the state of the system, is provided. A present preferred embodiment is installed in a standalone computer or network file server for the backup of the data storage devices, which are usually magnetic disk drives.

Upon installation, a base image corresponding to the initial state of the computer system is established and stored on a storage device. During the operation of the host computer, our system monitors changes to the state of the system and subsequently stores at least some of these changes on the storage device. In the preferred embodiment, these changes are the write actions to the magnetic disk. The changes are then mapped by location of the stored changes in an address table to enable subsequent retrieval of any selected changes. At a selected time subsequent to the establishment of the base image, when the address table has become full, at least one differential image of the state of the system is created. The differential image is created by compiling all changes to the base image which occurred 0 between creation of the base image and the selected time.

A virtual image may thus be created of data stored on the storage device, as such data existed at a preselected prior point in time. The virtual image comprises the base image altered by selected stored changes, as directed by the address table.

A file from such a prior state may be stored and retrieved by establishing a base image corresponding to the initial state of the computer system; storing the base image on a storage device; monitoring changes to the state of the system; storing the changes to the state of the system on the storage device; mapping locations of the stored changes in an address table to enable subsequent retrieval of any selected changes; and creating, at a selected time subsequent to the establishment of the base image, at least one differential image of the state of the system. The differential image is created by compiling all changes to the base image which occurred between creation of the base image and the selected time. A virtual image of data as stored on the storage device as such data existed at a preselected prior point in time is then created. The virtual image comprises the base image altered by selected stored changes, as directed by the address table, and is presented as a second, independent disk to the host system. Relevant portions of the virtual image corresponding to a file or files are selected by the user, and these portions are then copied onto a data storage device associated with the host computer system.

A method for storing any prior state of the storage device, and retrieving the prior state in its entirety for restoration onto a storage device, is also provided. This process is particularly useful if, for example, an entire disk drive is defective, or otherwise needs to be replaced. The data is already stored on a separate medium, and the physical device may be simply disconnected, and a fresh unit installed. The data is then restored to the new unit.

This is accomplished by first establishing a base image corresponding to an initial state of the host computer system. This image is then stored on a storage device. Changes to the state of the host system are then continually monitored and stored on the same storage device. The device is adapted to map the locations of the stored changes in an address table to enable subsequent retrieval of any selected changes. At a selected time subsequent to the establishment of the base image, at least one differential image of the state of the system is then created. The differential image is created by compiling all changes to the base image which occurred between creation of the base image and the selected time. A virtual image is then compiled of data stored on the storage device, as such data existed at a preselected prior point in time. The virtual image comprises the base image altered by selected stored changes, as directed by the address table.

The software then interrogates the storage device to determine the type of the device which has been installed. The device is prepared to accept data according to preset parameters determined by the type of the device. The virtual image is then copied, sector by sector, onto the storage device.

Our apparatus is utilized for storing and retrieving any prior state of a computer system. The system is preferably utilized in conjunction with a personal computer which may or may not be serving as a local area network file server. The computer has at least one primary data source, which may be a magnetically read hard disk, to and from which data is transferred. Such transfer changes the state of the system, and in the preferred embodiment, these changes are write actions to the hard disk. The hardware of the system is utilized to completely control and monitor the primary data source, here a hard disk, which would generally be controlled by the host computer itself.

The apparatus of the system centers on processing means and memory means associated with the processing means for the transient storage of data. Encoded within the system is software which provides the operating instructions and logic utilized by the apparatus.

The software is adapted to establish a base image corresponding to the initial state of the computer system upon installation of the system. Next, the base image is stored on the storage device, which may be a magnetically read hard disk, but is preferably an optically read disk. Changes to the state of the system are monitored by the software and associated hardware, and such changes to the state of the system are stored on the storage device. In the preferred embodiment, such changes constitute write actions to the primary data storage device. The locations of these changes are stored in an address table to enable subsequent retrieval of the changes as they are selected by the user. At least one differential image of the state of the system is also created, when the address table becomes full, by compiling all changes to the base image which occurred between creation of the base image and the selected time.

Means are provided for data communication between the primary data source and the processing means to enable the processing means to detect and record the changes to the state of the system within the memory means. This data communication may be either an Small Computer Systems Interface ("SCSI") type link or a Direct Memory Access ("DMA") type link.

At least one storage device is connected to the processing means for maintaining a record of the incremental changes to the primary data source. Additionally, a secondary storage device may be connected to the processing means wherein data from the primary data source may be mirrored onto the secondary storage device.

The software is also adapted to compile the virtual image of the storage device, as such data existed at a preselected point in time. As previously stated the virtual image comprises the base image, altered by selected stored changes, as directed by the address table.

These and other advantages and features of the present invention will be more fully understood on reference to the presently preferred embodiments thereof and to the appended drawings.

BRIEF DESCRIPTION OF THE DRAWINGS

FIG. 2 is a flowchart diagram of the initialization process for an optical direct access storage device of the system.

FIG. 3 is a flowchart diagram of the initialization of the SCSI ports of the system.

FIG. 4 is a flowchart diagram of the flushing of the archival queue of the system.

FIG. 5 is a flowchart diagram of the cleanup of the abbreviated transaction log of the system.

FIG. 9 is a flowchart diagram of a write operation utilized by the system.

FIG. 12 is a flowchart diagram of the creation of an interval utilized by the system.

FIG. 13 is a table diagram which illustrates the interconnection of the locational and archival data utilized in the system.

The flowchart diagrams illustrated in this application utilize a diagrammatic shorthand for iterative loop conditions. A circle having a cross is the initial conditional, while a terminal circle marks the end of the loop and the return to the initial condition. An upward arrow marks the end of a procedure or subroutine.

DESCRIPTION OF THE PREFERRED EMBODIMENTS

Our media fault tolerant disk backup system is designed to provide a means for providing fault tolerant storage and real-time data archiving/recovery for direct access storage devices (DASD). A virtual read/write disk constructed from archival information is present concurrently with the primary DASD, but hidden from the host system, and serves as a mirror of the primary DASD data. The system provides a means to create additional read-only virtual disks representing prior states of the primary DASD from the archival information, concurrently with the primary DASD and the current mirror image virtual disk.

The software consists of several elements, or layers. Each layer consists of at least one independent program or software driver which performs discrete functions. A multitasking, preemptive priority nucleus is provided for task management, task synchronization and message passing, dynamic memory allocation, hardware interrupt support and abstraction, DMA control and dynamic program loading.

A physical device driver layer is provided, consisting of dynamically loaded device drivers which support the specific DASD devices to be communicated with along the SCSI channels.

A logical function layer performs logical mapping of I/O requests to primary DASD devices, maintenance of differential, incremental and queue tables for the Optical DASD, error recovery and virtual disk algorithms.

The backup system hardware is preferably installed in a server, or host, of a network of computers. The system may, however, be utilized in conjunction with any standalone computing system. The system is designed to provide a means for intelligent control of file server peripherals, uncomplicated management of unusual peripheral types, the creation of abstract peripheral devices, online image backups and fault tolerance at the media level through mirroring and/or incremental backup.

Figure 1:
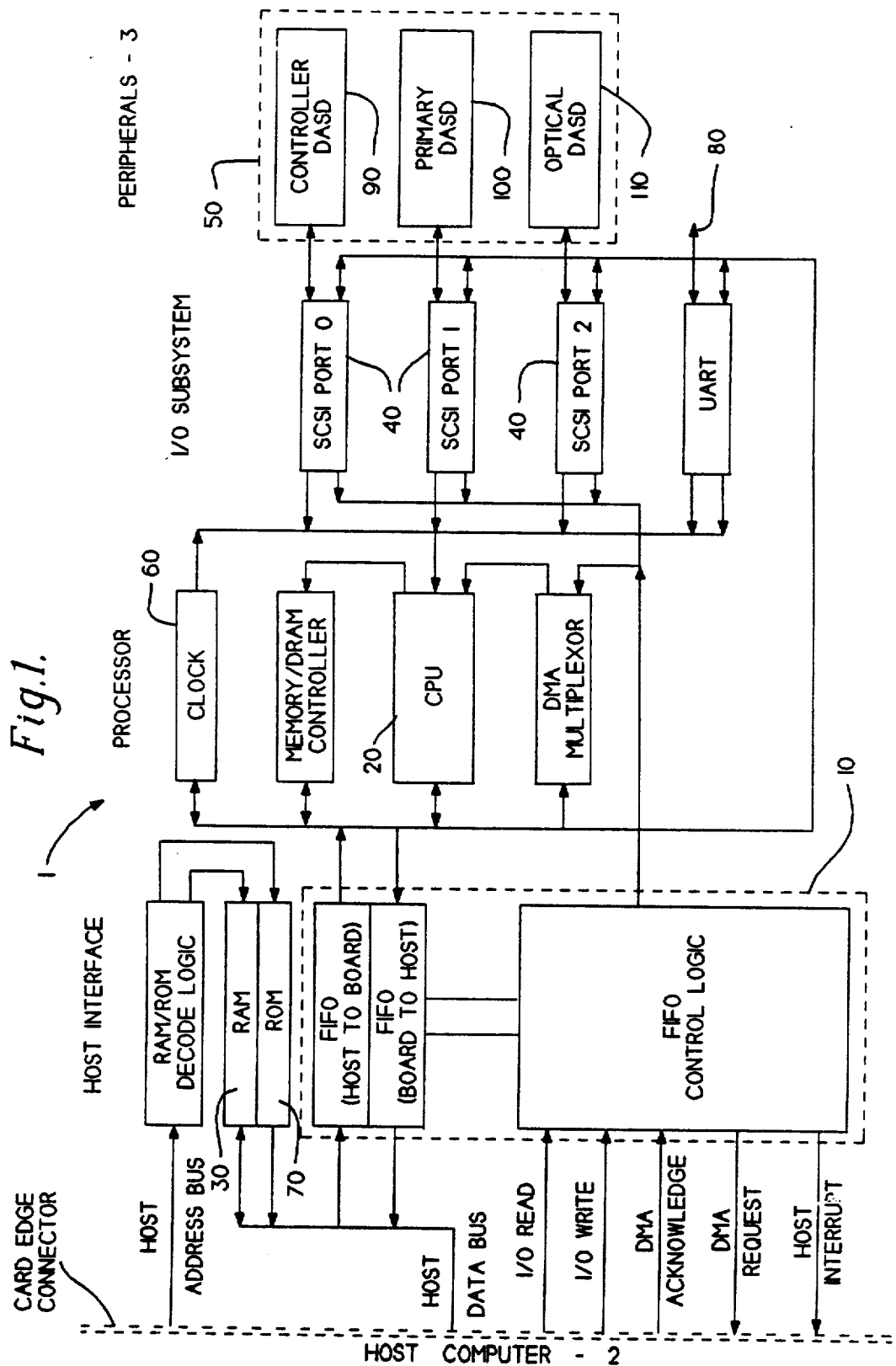
FIG. 1 is a diagrammatic view of the hardware of a present preferred embodiment of our invention.

Referring to FIG. 1, a present preferred embodiment of the apparatus of our system is disclosed. The apparatus may be broken out into two major component areas: (a) the controller circuit board 1, which is inserted into a host computer 2, and (b) the peripherals section 3, having one or more magnetic primary DASDs 100, one or more optical DASDs 110, and an additional magnetic controller DASD 90. The controller DASD 90 is used by the controller circuit board 1 and its associated circuitry for storage of loadable physical device drivers, utilities and a queue for optical DASD 110. Each of the DASD devices has its own unique format. The controller circuit board 1 has three subsections: the host interface section, the processor section, and the I/O section.

We provide a single board computer with an SCSI interface (not shown) or DMA/FIFO (first in first out) 10 to the host system bus. Processor 20, which is preferably an Intel 80186 processor, forms the hub of the system. Random access memory 30, preferably between 512 and 1024 kilobytes, is provided for use by the processor 20 for the transient storage of data and program material. A plurality of SCSI control channels 40 provide data communication with peripheral DASD devices 50, which are usually magnetically read fixed or "hard" disk drives, or optically read drives. These SCSI ports may also be utilized to communicate with the host computer in the absence of an interface 10. A clock/calendar chip 60 may be provided for the convenience of the user, eliminating the need to enter such information upon "power up" of the device. Read only memory 70 is provided for permanent storage of operational software and related data, and is provided to be accessed by host computer 2 upon initialization of the system. An RS-232 serial interface port 80 is provided to allow communication of the device with an external terminal or other computer. Our system also incorporates an EPLD based DMA circuit which permits direct input/output (I/O) to I/O patching of data, eliminating the usual I/O to memory to I/O transfer delay.

This description will first set out the physical arrangement of the information on the DASD devices and the internal memory followed by a description of the operation and interaction of the various hardware and software elements.

Organization of the Physical Devices

The primary DASD 100 is partitioned into two or three physical areas: (1) the user data area, which occupies approximately 95% of the device; (2) the optional archival queue mirror area, which may occupy up to 5% of the device; and (3) the descriptor area, which requires only one sector of the device.

The user data area is the area of the primary DASD 100 which is presented to the host system for its data storage. The host system freely operates on this area, imposing any file structure it requires.

The archival queue mirror is a duplicate location for data which is to be transferred to the optical DASD 110. In the event of a queue failure in the controller DASD 90, the data may be obtained from the primary DASD 100 queue. The archival queue mirror, if included, is hidden from the host system by indicating to the host that the primary DASD is smaller than it actually is by the size of the archival queue mirror and descriptor.

The descriptor, located in the last logical block on the primary DASD 100, describes and uniquely identifies each of the primary DASD devices 100, utilizing four elements or variables. The first element is a 16 character ASCII representation of the date and time the media was formatted by the controller, in the form MM/DD/YYHH:MM:SS. The second element is the queue start logical block address, or LBA. This is a 32 bit integer which specifies the logical block address of the start of the data queue. This value is the size in blocks of the primary DASD 100 which is presented to the host system. The third element of the descriptor is the queue size, which is the number of logical blocks of the primary DASD 100 which the archival mirror queue consumes. The last element is the checksum, a 16 bit integer containing the bitwise inversion of the modulo 65536 sum of prior words in the descriptor. This element is utilized to check the integrity of the prior data. If the checksum is found to be invalid, the controller assumes 1) that the device has a nonexistent or unknown format, 2) the entire primary DASD is available to the host system, 3) no archival queue mirror exists on the device and 4) that the descriptor sector may not be written by the controller unless the media is formatted by the controller.

The controller DASD 90 is partitioned into three areas: (1) the drivers and utilities area, (2) the archival queue area, and (3) the descriptor. The drivers and utilities area is a group of 32 sections of 64K bytes each where loadable drivers and utility programs are located. Drivers are loaded during the initialization of the system in response to the determination of specific physical devices. The archival queue area is a data buffer in which archival data targeted for the optical DASD 110 is queued. Because of the generally high latency and low bulk transfer rates of optical DASDs, this queue serves to pipeline the transfer of archival information during times of high write request loads. The queue is arranged in a circular fashion, with head and tail pointers indicating the append and remove location. The pointers are located in battery backup clock ram to preserve them in the event of a power failure. The head and tail pointers are only altered after the successful completion of read/transfer or write operations. In addition, the queue may be mirrored on the primary DASD 100 for increased reliability. The descriptor is identical in structure to that on the primary DASD 100 and is utilized for the same purposes.

Optical DASD 110 is partitioned into several different areas. The first elements stored on the optical DASD 110 are two descriptors, which, unlike the descriptors of primary and controller DASD devices 100 and 90, respectively, are located in the first and second logical blocks of optical DASD 110. The first descriptor, located in the first logical block of the optical DASD 110 contains information describing the optical DASD 110 and the data it contains. This first descriptor also specifies some characteristics of the primary DASD 100. The second descriptor, located in the second block of the optical DASD 110, when written, uses date and time information as a terminal time stamp for the optical DASD 110, indicating that the optical DASD 110 is full or out of service, and should not be modified further. It may, however, be mounted as a read-only virtual disk.

The first descriptor comprises several elements to track the characteristics of the optical and primary DASD devices 110 and 100, respectively. The information stored relating to the primary DASD 100 generally concerns the formation of the base image of the primary DASD 100 on the optical DASD 110. A 16 character ASCII representation of the date and time the archival information of the primary DASD 100 was initially written on the optical DASD 110, is stored in the form MM/DD/YYHH:MM:SS. Following is the number of logical blocks on the primary DASD 100 represented by the archival information, identified as P-DASD blocks. The indicated size of this area which is filled by the base image of the primary DASD 100, is identical to the user data area on the primary DASD 100 from which the archival data is taken. The size in bytes of each block on the primary DASD is then recorded as the P-DASD block size.

Information is also stored in the first descriptor relating to the physical space on the optical DASD 110 onto which data is to be written. The number of blocks of optical DASD 110 consumed by the base image of the primary DASD 100 is stored as the base image block. The starting point for the interval map data written to the optical DASD 110, which is subsequently described in detail, is recorded and identified as interval map start, or I-Map start. The variable I-Map Blocks tracks the number of blocks reserved for the interval map entries.

Following the descriptors, the base image of the primary DASD 100 is stored on optical DASD 110, which is a duplicate copy of the user data area of the primary DASD 100 at the time of the installation of the system.

Following the base image, the interval map table is installed on the optical DASD 110. The structure of the interval map table, like the descriptors, is also a collection of elements or variables which track the characteristics of data written to the primary DASD 100 in the form of incremental data and differential images. The differential images comprise a differential map, located at the first block of the differential image, followed by the differential data, as described subsequently.

The first element of the interval map table is an ASCII representation of the date and time an interval entry was created. The block on the optical DASD 110 where the start of the differential map and image are located is recorded as the differential start, and the size of the map, in bytes is recorded as the differential map size. The starting point of the differential data which follows the differential map is stored as the differential data start, and contains a 32K byte cluster of primary DASD blocks for each bit set in the differential map. Differential data blocks tracks the number of blocks on optical DASD 110 used to contain the differential data.

The interval map table also records data relating to incremental data storage on optical DASD 110, namely where interval data entries are stored. An entry is appended at each interval point. The block on the optical DASD 110 where the map for the previous incremental data is located is stored as the last incremental map start, while the size of the previous incremental map, in bytes is stored as last incremental map size. The location at which the next, or current incremental data area is to be written on optical DASD 110 is recorded as current incremental start. The location of the first incremental data is stored as a optical DASD offset variable A-Log Start, to be recorded in the abbreviated transaction log, described subsequently. A checksum is provided to check the integrity of the data in the interval map table.

The number of entries allocated for the interval map table is determined by the following formula:

$$IMTE = BOD \times (OBS/PBS)/ITE$$

where:
  IMTE - Interval Map Table Entries (blocks)
  BOD - Total number of blocks on the optical DASD
  OBS - The size in bytes of each block of optical DASD
  PBS - The size in bytes of each block of primary DASD
  ITe - The maximum number of incremental table entries A differential completion flag exists in clock RAM which indicates the successful completion of the differential image.

The abbreviated transaction log is the next element stored on optical DASD 110 following the interval map table. This is a contiguous listing of all blocks altered, the time altered, and the location of the changed data on optical DASD 110. The data contained in the abbreviated transaction log is organized into a number of subelement. The first subelement is a 32 bit integer which contains the encoded date and time of each transaction. The block of primary DASD 100 which was altered is stored as P-Block. The subelement O-Location specifies the location, in byte offset from the start of optical DASD 110, where the descriptor which precedes the archived data is located. The incremental table entry number where this transaction was cataloged is also tracked, and is used by the archival queue manager to convert the incremental table mapping from the queue to optical DASD 110. The size of the abbreviated transaction log is calculated using the following formula:

$$ATLB = IMTE \times ITE \times ATLE/OBS$$

where:
  ATLB - The number of abbreviated transaction log blocks
  IMTE - The number of interval map table entries
  ITE - The maximum number of incremental table entries
  ATLE - The size in bytes of an abbreviated transaction log entry
  OBS - The size in bytes of a block of optical DASD.

The remainder of optical DASD 110 is reserved for the storage of the incremental data and differential images. Each incremental data entry is the previous incremental map followed by a detailed transaction listing. The transaction listing is a transaction log entry followed by the altered data for the specified block of the primary DASD 100. This data is continually appended until a differential image is produced. The descriptor of the incremental table, described subsequently, indicates the locations of the constituent elements of the incremental data. Each differential image is comprised of a differential map locating 32K clusters of the primary DASD 100 which have been altered since the last differential image was made, and the data itself. The incremental table descriptor indicates the location of the constituent elements of the differential data area.

Organization of the Internal Memory

The data which is manipulated in internal random access memory 30 also is organized in a unique structure to closely interact with the data stored on the physical disks. Three maps are provided to maintain a continuous record of the various operations of the system: (1) the differential map, (2) the composite differential table, and (3) the incremental table.

The differential map contains 1 bit for each sequential 32K cluster of blocks on primary DASD 100. Whenever a write operation is requested, the bit which corresponds to the cluster which contains the target block is set. This results in a map of 32K areas of primary DASD 100 which have been altered. When the memory resident incremental table becomes nearly full, a differential image of the primary DASD 100 is produced representing the net of all changes since the last differential image, or the base image if no differential images have been produced. The system creates this map during initialization by interrogating the abbreviated transaction log for entries which have been appended since the start of the most recent incremental data set, and setting the appropriate bits for clusters which have been altered.

The composite differential table contains a 32 bit unsigned integer for each 32K cluster of primary DASD 100, specifying the location where the cluster was last recorded on optical DASD 110. The system creates this table during initialization by filling all entries in the table with the appropriate location of primary DASD clusters in the base image, then replacing the table locations of clusters found to exist in subsequent differential images cataloged in the interval map on optical DASD 110.

The incremental table is a memory based table which maps the locations of altered blocks of primary DASD 100 when recorded to optical DASD 110. Each time a write occurs to primary DASD 100, the table is updated by adding or replacing an entry point corresponding to the block of primary DASD 100 which has been altered. The table construction is a hash table with separate chaining. The entries in the table are placed and located by using the lower 13 bits (bits 0 through 12) of the block address as an entry point into the table. If the entry at that location is used, a free entry is located and the new entry appended to the linked list for that location.

The entry points are 16 bit unsigned integers which indicate the incremental entry number which is the head of a chain of incremental entries having identical lower 13 bits in their P-Block fields. If the field contains a value of 0ffffh, then the entry point does not yet refer to any transactions. The incremental entries themselves specify the location of archived incremental data. There is enough room in memory for 8192 such entries. Each time the memory based incremental map table approaches its capacity, a differential image is then produced on optical DASD 110, representing the end of an incremental interval. The differential image reflects 32K areas or clusters which have been altered since the last interval. In order to close the interval, space on optical DASD 110 is reserved for the differential image and the current incremental map. The incremental map and entry points table are then written to the optical DASD 110, and the memory based incremental map and entry points table are cleared. In the event the system is interrupted by failure or power outage, causing the differential image to be incomplete, sufficient information is contained in the preserved copy of the incremental table to be recovered.

The structure of the incremental entries utilizes three subelements or variables. The first of the subelements is the upper 16 bits (bits 13 to 28) of the primary DASD block which this entry represents, and is labeled P-Block. The link variable is the entry number of the next entry appended to this thread because the lower 13 bits of the primary DASD block address were identical to this entry. If the link value is 0fffeh, it signifies the end of the linked list, but if the value is 0ffffh an unused entry is signified. The last of the variable subelements is arc-location, the location of the archived data. If bit 31, the most significant bit of this value is set, then the location specifies an offset in the archival queue. If not set, then the offset is a location in the optical DASD 110. The archival queue manager will convert the entry arc-location from queue to optical DASD 110 as it is removed from the queue and transferred to optical DASD 110.

The Operation of the System

Referring to FIG. 2, the initialization of the optical DASD 110 is shown as a series of steps which create the structure described above. The primary DASD 100 is interrogated to determine the physical characteristics of its structure, and the data contained thereon. The space requirements are then calculated for the base image, the interval map table and the abbreviated transaction log. The characteristics of the primary and optical DASD 100 and 110, respectively, are then combined to form the first descriptor stored on the optical DASD 110. The checksum is calculated to serve as an integrity check during later operations utilizing the data from the descriptor. The base image is then copied from the primary DASD 100, and written to the optical DASD 110. An interval map is then created on optical DASD 110, and space is reserved for the transaction log and the abbreviated transaction log. A checksum for the interval map table entry is also generated.

Finally, the time and date is entered, all variables and flags are set to zero, the differential map and incremental tables are cleared, the composite differential table is initialized, the archival queue is initialized, and the differential flag in clock RAM is cleared.

The initialization of the system upon powerup, as illustrated in FIGS. 3-8, consists of initializing the SCSI devices, loading the physical drivers which the devices require from the controller DASD; flushing the archival queue; performing cleanup operations on the abbreviated archival transaction log; completing the differential image, if incomplete; creating the differential map; creating the incremental table and creating the composite differential table. It is to be understood that each of these operations may be performed in any sequence, and that the system is not limited to any particular order thereof.

The SCSI devices are initialized as shown in FIG. 3 by performing a hardware reset on all devices on each of the three SCSI ports. Each SCSI device ID is interrogated with a test unit ready request. Devices responding have the eight logical unit numbers, or LUNs, interrogated by an inquiry request. The physical driver indicated by the manufacturer and model of the unit is loaded from the controller DASD 90 and sent an initialization request.

Referring to FIG. 4, if the archival queue is utilized, it is flushed to the optical DASD 110. This is performed by starting with the tail pointer for the queue, which is contained in clock RAM, and sequentially transferring the data indicated in the transactions to the optical DASD 110. This will leave the detailed transaction log accurate to the time of shutdown.

The cleanup of the abbreviated transaction log is shown in FIG. 5. The current incremental data area is located by performing a binary search of the interval map to locate the last entry. The end of the abbreviated transaction log is located by performing a binary search of the log. The search begins with the location indicated in the last entry of the interval map, which is the start of the abbreviated log for the current session of incremental data. This determines the last valid abbreviated transaction recorded, which is then used as an entry point into the detailed transaction log. The transaction headers specified in the detailed transaction log are then appended to the abbreviated transaction log to cause them to directly correspond.

Figure 6:
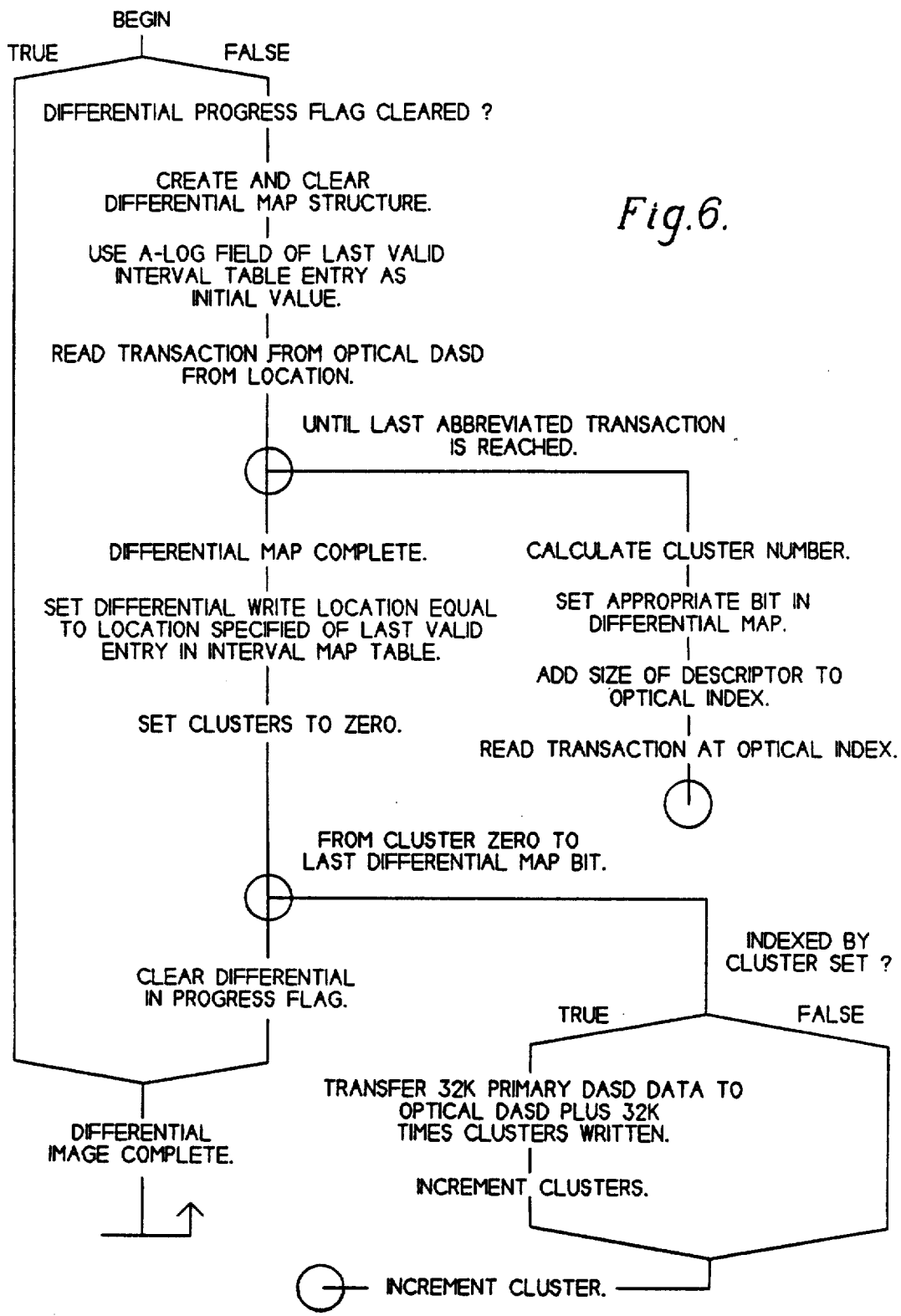
FIG. 6 is a flowchart diagram of the completion of the differential image of the system.

The differential image is completed, if necessary, as shown in FIG. 6. A flag in the battery backup clock RAM indicates the status of the most recent differential image. If the flag indicates that the differential image was not completed, a differential map is generated based on the incremental table indicated in the last entry in the interval map. The transactions in the table are used to set the appropriate cluster bits in the differential map. Once the table has been evaluated, the differential image operation is restarted, and allowed to run to completion.

Figure 7:
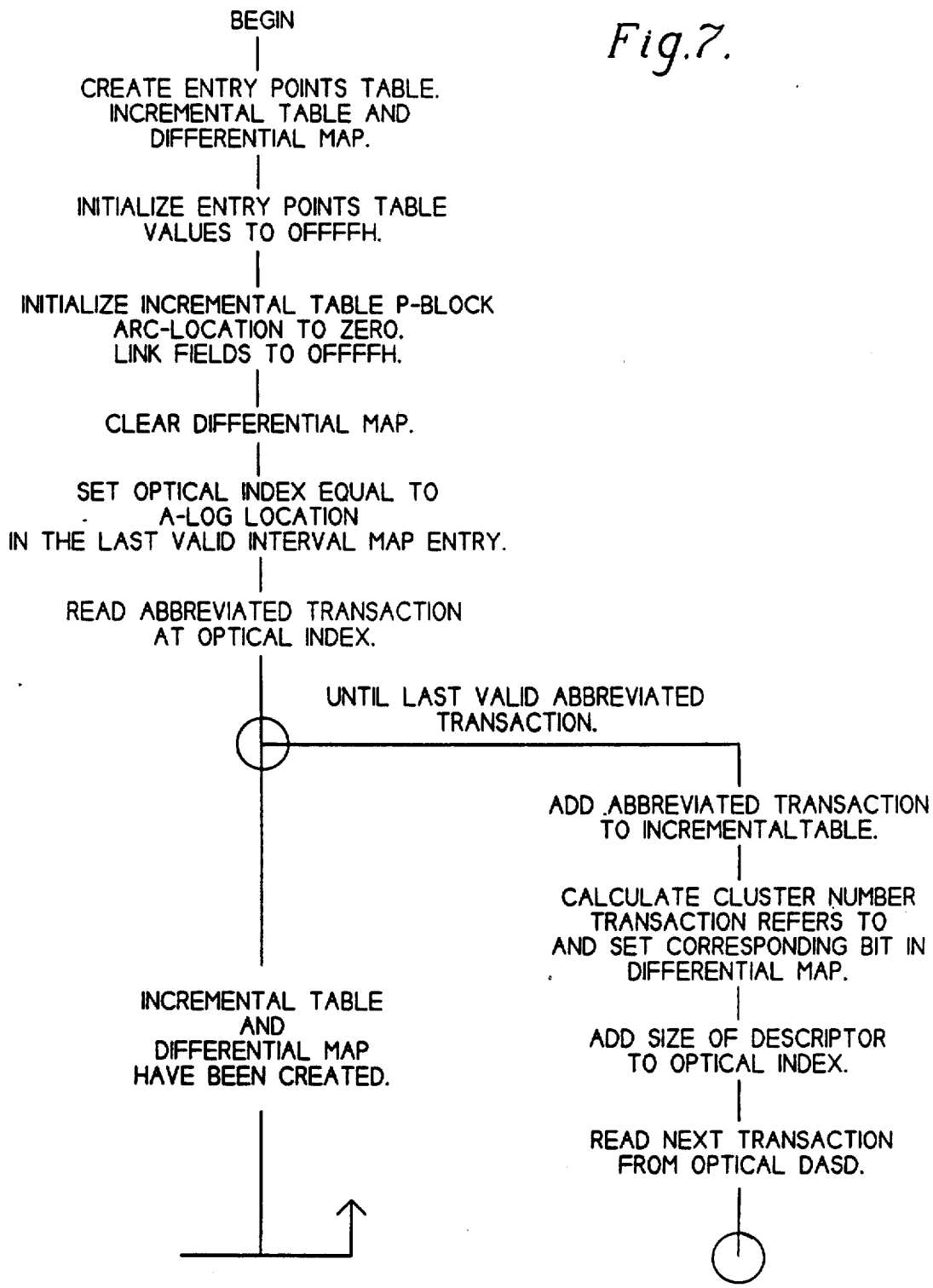
FIG. 7 is a flowchart diagram of the creation of the incremental table and the differential map of the system.

Referring to FIG. 7, the incremental table is created from the transactions recorded in the abbreviated transaction log since the base or last differential image. The differential map is created from the clusters of primary DASD 100 which the transactions have indicated as altered. This leaves the incremental and differential tables in the same state as they existed at the time of the last system shutdown.

Figure 8:
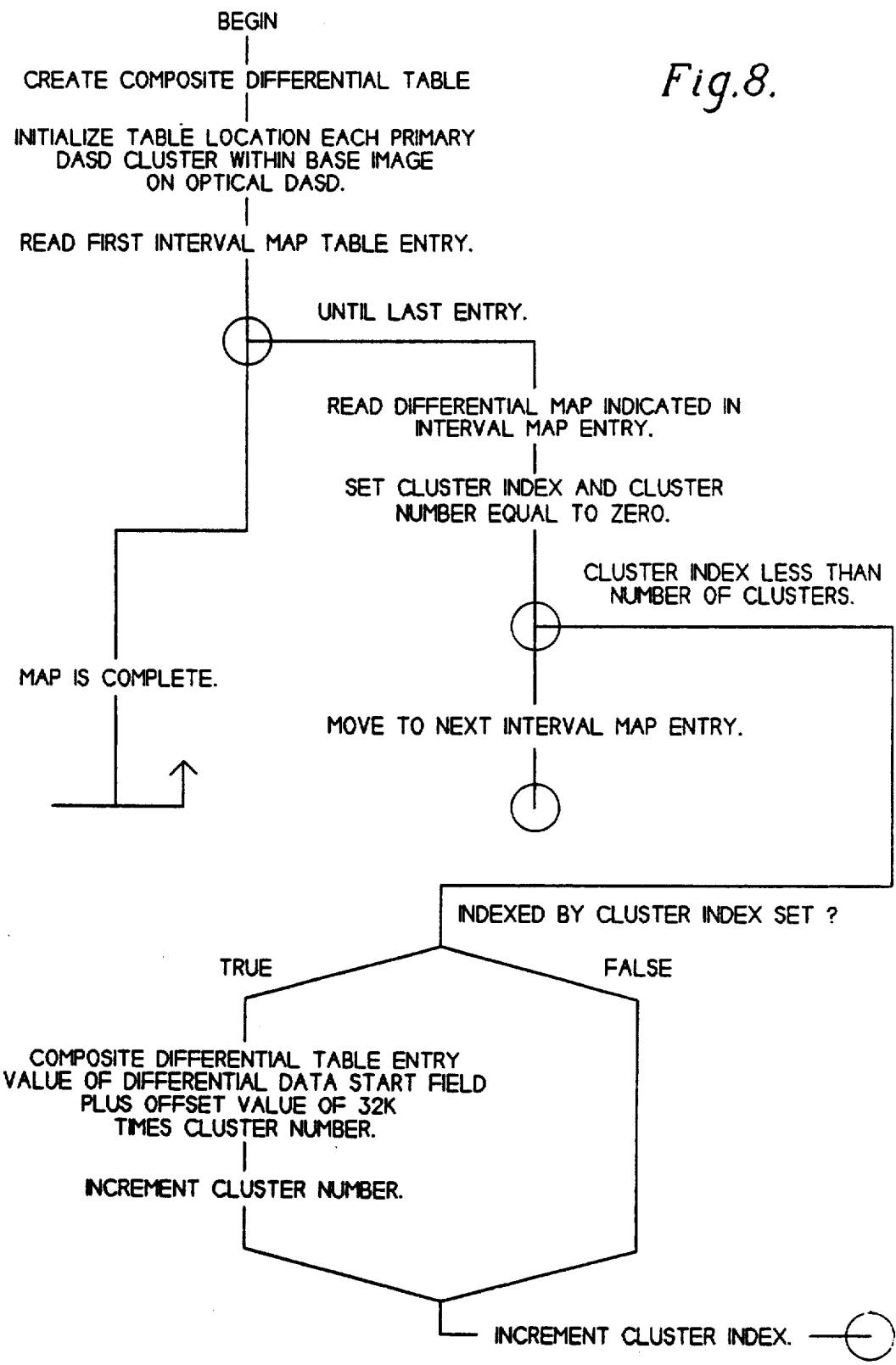
FIG. 8 is a flowchart diagram of the creation of the composite differential table of the system.

To understand the course of normal operations, it may be helpful to reference FIG. 13 in addition to the indentified figures in the following description. As shown in FIG. 8, the composite differential table is generated by first filling in the table with the optical DASD 110 block location of every 32K cluster of primary DASD 100 which is recorded in the base image. The interval map entries are then sequentially inspected, and each subsequent differential image evaluated. Any clusters found in subsequent differential images supercede the location of the clusters in the base image by replacing the block address with that of the cluster in the differential image. This process continues until the differential images are exhausted. The composite differential table in conjunction with the incremental table provides a virtual disk which always reflects the current state of the primary DASD 100 via the archival data. Blocks not denoted in the incremental table exist at the location indicated by their cluster in the composite differential table in the base image or a subsequent differential.

Write requests to primary DASD 100 are processed as shown in FIG. 9. This is accomplished by first creating an incremental descriptor. This descriptor consists of the upper 16 bits, which are bits 13 to 28, of the block address of primary DASD 100 which is to be altered, and the location on optical DASD 110 within the current incremental data area, or detailed transaction logs, where the transaction is to be appended. The process continues by determining which 32K cluster of primary DASD blocks that the request resides in and setting the bit in the differential map corresponding to that cluster. The transaction is then inserted into the incremental table, and the descriptor and data are transferred to the optical DASD 110 or archival queue. As also shown in FIG. 13, when a archival queue is present, the arc-location field in the descriptor which is inserted in the table indicates the location in the archival queue where the descriptor and data were appended. The most significant bit of the arc-location field is then set to indicate that the data exists in the queue and has not yet been transferred to the optical DASD 110.

The descriptor is inserted into the incremental table by using the lower 13 bits of the primary DASD block address as an index into the entry points table, or entry point indexes, for the incremental table, as shown in FIG. 13.

If the entry point index indicates a value of 0ffffh, then no descriptors have been entered into the table which match the lower 13 bits of the primary DASD block address for the descriptor to be inserted. If this is the case, then the first free entry in the incremental entries table is located by performing a binary search of the incremental entries table, for a link field recognized by a value of 0ffffh. The entry number found to be free is placed in the entry points table at the entry point index. The descriptor is then placed into the incremental table, and the link field of the descriptor is set to 0fffeh to indicate that it is the terminal link in the chain of descriptors which match the lower 13 bits of the primary DASD block address.

If the entry point index indicates a value other than 0ffffh, then it contains the head of a linked chain of descriptors, as shown in FIG. 13, which all refer to primary DASD block addresses which have been added to the table with identical values for the lower 13 bits of the block address. Starting with the entry indicated by the entry points field, each descriptor in the chain is inspected for a match for the primary DASD block address for the descriptor to be inserted. This match is determined by comparing the upper 16 bits of the primary DASD block address (bits 13 to 28) with those in the P-Block field of the entries. If a match is found, the existing descriptor will be overwritten by the new descriptor. If the end of the chain is reached without a match, signified by a link field of 0fffeh, then a free entry is allocated as described above, the entry is filled in, and the link field of the last descriptor in the chain is set to point to the newly added descriptor.

If a differential image is in progress, and the write request falls within a cluster marked to be included in the differential image and the differential image task has not yet transferred that cluster to the optical DASD, the cluster marked will be transferred immediately to its appropriate location in the differential image, and the cluster bit in the differential image map is cleared. The data written is then transferred to the primary DASD 100.

Figure 10:
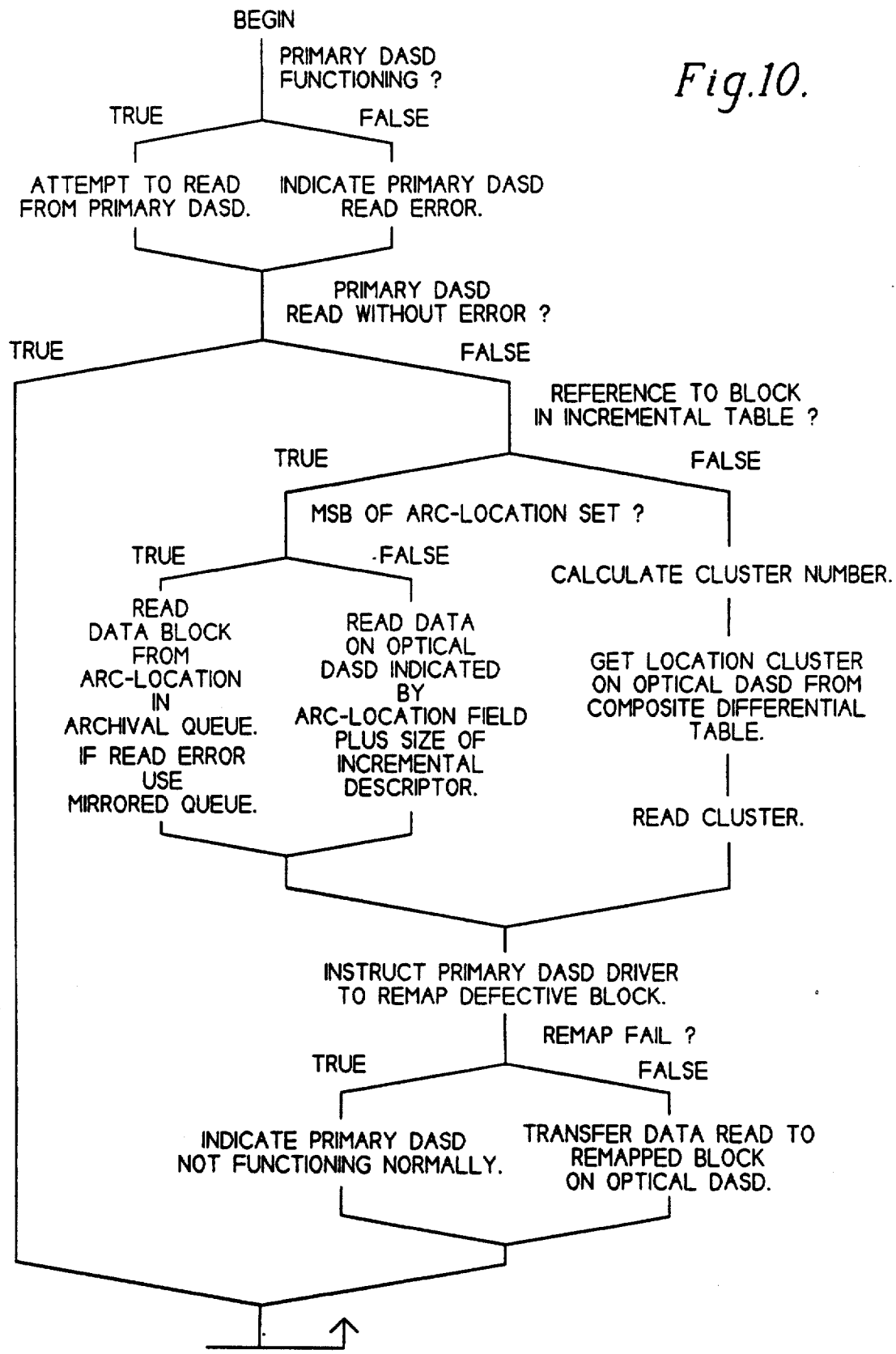
FIG. 10 is a flowchart diagram of a read operation utilized by the system.

Read operations, as illustrated in FIG. 10, are normally satisfied by primary DASD 100. In the event of read errors, the physical driver for the primary DASD 100 is requested to remap the bad block, preferably by an SCSI command and the current data is retrieved by inspecting the incremental table to determine if a descriptor for the block exists in the table. If a descriptor does exist, the data is retrieved from either the incremental data or the archival queue as indicated by the most significant bit of the arc-location field of the descriptor. If no descriptor is located in the incremental table, the composite differential table is interrogated for the location of the most recent cluster which contains the desired block. The data is then transferred from the optical DASD 110 to the primary DASD 100, and to the requestor.

In the event of a complete failure of primary DASD 100, all requests are satisfied as described above, except that remapping of bad blocks is not attempted. Once the defective primary DASD 100 is replaced, it is restored to normal operation by sequentially copying, block for block, the data from the virtual disk, created from the archival data, to the primary DASD 100. Normal write requests are performed as normal with only one restriction: the transfer of a block from the virtual disk to primary DASD 100 may not be interrupted by any intermediate write to the block being restored to the primary DASD 100.

If the archival queue is mirrored, any read errors encountered are resolved by instructing the driver for the controller DASD 90 to remap the defective block, transferring the corresponding block from the mirrored archival queue to the controller DASD 90 and to the requestor.

Figure 11:
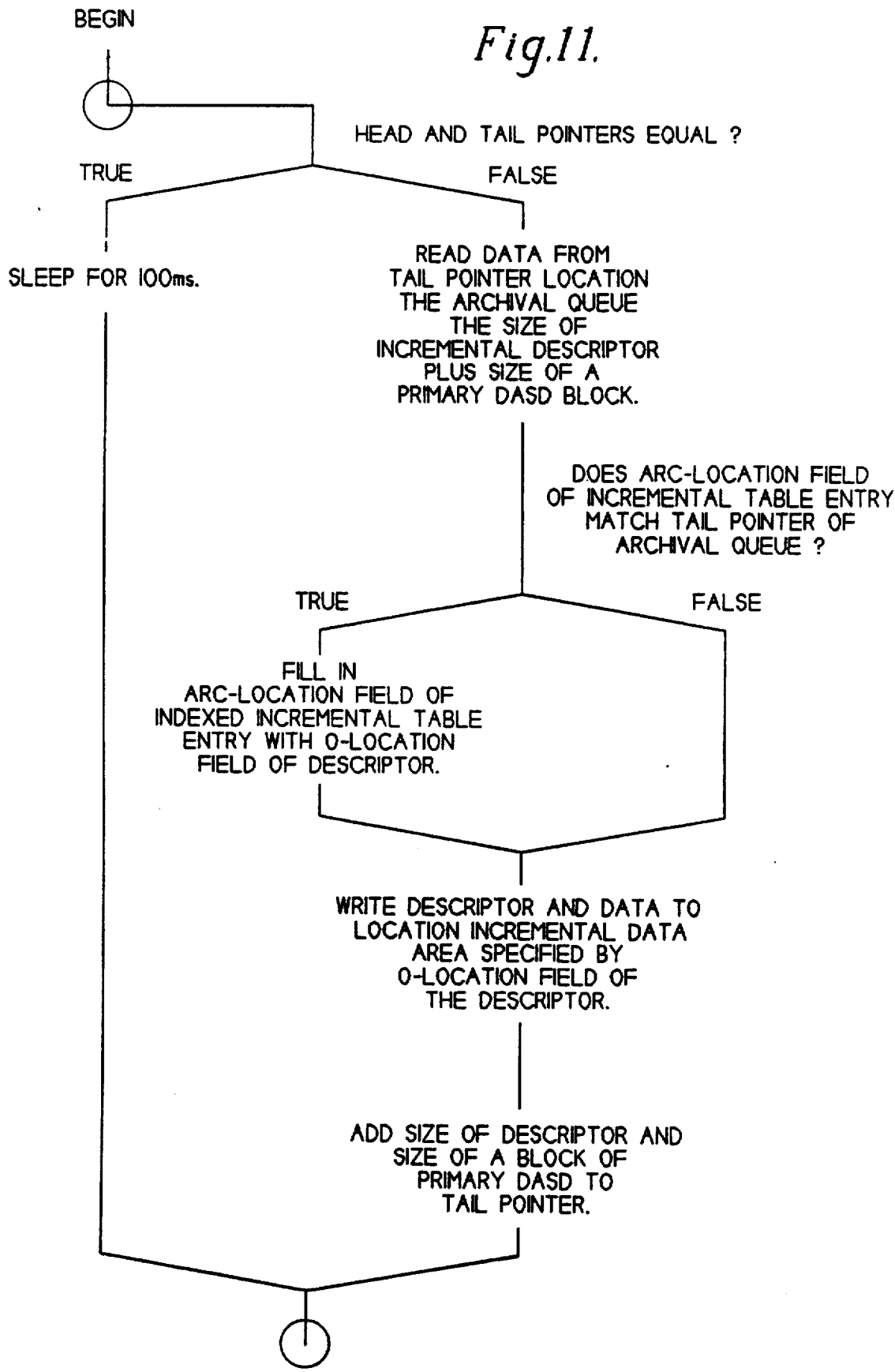
FIG. 11 is a flowchart diagram of the operation of the archival queue of the system.

As illustrated in FIG. 11, the archival queue manager performs the functions of appending data to the queue, reading data from the queue and transferring it to its target location, and performing random access requests to data in the queue. Each time data is appended to the queue the queue manager increments the head pointer, located in clock RAM, to reflect the addition of data. If the head pointer reaches the end of the physical queue, the pointer wraps around to the start of the queue. The queue manager determines that data exists in the queue by comparing the head and tail pointer. If they are found to be not equal, then data exists in the queue, and the manager reads the data from the queue and evaluates the transaction descriptor. Next, the data is transferred to its target location in the incremental data area as indicated by the arc-location field of the descriptor. The location in the queue from which the data was removed is then compared with the arc-location field of the descriptor in the incremental table entry. The correct incremental table entry is indicated by the entry field of the descriptor which has been removed from the queue.

If the arc-location matches, then the arc-location field of the entry in the incremental table is replaced with the arc-location indicated in the transaction descriptor removed from the queue. This operation converts the arc-location fields of incremental table entries with queued data to be converted from queue pointing to optical DASD pointing. If the arc-location fields do not match, then a second write operation to the particular primary DASD block has occurred before the previous transaction was removed from the queue, and the incremental entry is not altered.

When the incremental table becomes nearly full, an interval entry in the interval map is created as shown in FIG. 12. A differential image is created, the current incremental table is saved to optical DASD, the incremental table is cleared and a new incremental data area is started. The interval map entry is constructed by first filling in the current date and time. The differential start field is filled in with the next free block on optical DASD 110. The differential map size field is filled in with the size in bytes of the differential map. The differential data start field is then filled in with the location of the next block of optical DASD 110 and a 32K byte cluster of primary DASD blocks for each bit set in the differential map. The differential data blocks field is filled in with the number of data blocks of optical DASD corresponding to 32K bytes of data for each bit set in the differential map. The last incremental map start field is filled in with an optical DASD block location which is computed from the sum of the differential data blocks field and the differential data start field. The last incremental map size is filled in with the size in bytes of the current incremental table. The current incremental start field is filled in with the next free optical DASD block following the space reserved for the current incremental table. The A-Log field is filled in with the location in the abbreviated transaction log where the next abbreviated transaction will be appended. The checksum is then calculated and the structure is written to the next free entry location in the interval map.

The current differential map is written to optical DASD 110 at the location indicated by the differential start field interval table entry. The current incremental table is written to the location indicated by the last incremental map start field of the entry. The incremental and entry points tables are then cleared.

The differential image in progress flag is set in clock RAM. A copy of the differential map is made, and the original cleared to indicate no clusters altered. Each bit in the differential map is then sequentially inspected, and those found to be set in the differential map copy results in the 32K cluster of primary DASD, corresponding to the bit number set, e.g. bit 0, cluster 0; bit 1, cluster 1, being appended to the area of optical DASD 110 reserved in the differential data area, which is defined by the differential data start field and the differential data blocks field. As each marked cluster in the differential map is transferred to the optical DASD 110, the composite differential table is updated with the revised location of the cluster in the current differential image area.

A read-only virtual disk is created to allow the restoration of data by file to the host primary DASD 100. This is accomplished by determining the time which the disk is to represent and creating a composite differential table and an incremental table.

The composite differential table is generated first filling in the table with the block location on optical DASD 110 of every primary DASD 32K cluster which is recorded in the base image. The interval map entries are then sequentially inspected, and each subsequent differential image evaluated to determine if the date and time indicated in the entry is less than or equal to the requested time. Any clusters found in these selected differential images supercede the location of the clusters in the base image by replacing the block address with that of the cluster in the differential image. This process continues until a differential image with a date and time greater than the requested time is located, or no more interval map entries exist.

The incremental table is created by entering the transactions recorded in the abbreviated transaction log starting with the A-Log location indicated by the last interval map entry previous to the requested date and time, and stopping at the next transaction more recent than the requested date and time.

Read requests from the virtual disk are satisfied by first inspecting the incremental table to determine if any transactions exist in the table for the requested blocks. If found to exist, the request is satisfied from the location of optical DASD 110 indicated in the arc-location field in the transaction entry. Otherwise, the composite differential map is used to determine the location on optical DASD 110 of the cluster which contains the desired block.

In describing our preferred method and apparatus, we have utilized single components such as the optical DASD to perform several functions. It should be apparent to those skilled in the art that multiple components or comparable components could be used to perform these functions.

While we have described a present preferred embodiment of the invention, it is to be distinctly understood that the invention is not limited thereto but may be otherwise embodied and practiced within the scope of the following claims.

We claim:

1. A method for storing and retrieving any state of a computer system which has occurred within a time period between a point in time at which the computer system contains at least one of a program and data in an initial state and some later point in time and during the time period data is transferred and such transfer changes the state of the system, comprising the steps of:

a) establishing a base image corresponding to the initial state of the computer system;

b) storing the base image on at least one storage device;
c) monitoring changes to the state of the system;
d) storing the changes to the state of the system on the at least one storage device;
e) mapping locations of the stored changes in an address table to enable subsequent retrieval of any selected changes; and
f) creating, at a selected time when the address table becomes full, subsequent to the establishment of the base image, at least one differential image of the state of the system, by compiling all changes to the base image which occurred between creation of the base image and the selected time.

2. The method as described in claim 1, further comprising the step of compiling a virtual image of data stored on the storage device, as such data existed at a preselected prior point in time, wherein the virtual image comprises the base image altered by selected stored changes, as directed by the address table.

3. The method system as described in claim 1, wherein all changes to the state of the computer system are stored.

4. A method for storing any state of a storage device contained within a computer system which has occurred within a time period between a point in time at which the computer system contains at least one of a program and data in an initial state and some later point in time and during the time period data is transferred and such transfer changes the state of the system, and retrieving a file from such a prior state, comprising the steps of:
a) establishing a base image corresponding to the initial state of the computer system;
b) storing the base image on at least one storage device;
c) monitoring changes to the state of the system;
d) storing the changes to the state of the system on the at least one storage device;
e) mapping locations of the stored changes in an address table to enable subsequent retrieval of any selected changes;
f) creating, at a selected time when the address table becomes full, subsequent to the establishment of the base image, at least one differential image of the state of the system, by compiling all changes to the base image which occurred between creation of the base image and the selected time;
g) compiling a virtual image of data stored on the storage device, as such data existed at a preselected prior point in time, wherein the virtual image comprises the base image altered by selected stored changes, as directed by the address table;
h) loading the virtual image into the memory of the computer system;
i) selecting relevant portions of the virtual image; and
j) copying the relevant portions of the virtual image onto a data storage device associated with the computer system.

5. A method for storing any state of a storage device contained within a computer system which has occurred within a time period between a point in time at which the computer system contains at least one of a program and data in an initial state and some later point in time and during the time period data is transferred and such transfer changes the state of the system, and retrieving the prior state in its entirety for restoration onto a storage device, comprising the steps of:

a) establishing a base image corresponding to the initial state of the computer system;
b) storing the base image on at least one storage device;
c) monitoring changes to the state of the system;
d) storing the changes to the state of the system on the at least one storage device;
e) mapping locations of the stored changes in an address table to enable subsequent retrieval of any selected changes;
f) creating, at a selected time when the address table becomes full, subsequent to the establishment of the base image, at least one differential image of the state of the system, by compiling all changes to the base image which occurred between creation of the base image and the selected time;
g) compiling a virtual image of data stored on the storage device, as such data existed at a preselected prior point in time, wherein the virtual image comprises the base image altered by selected stored changes, as directed by the address table;
h) interrogating the storage device to determine the type of the device;
i) preparing the device to accept data according to preset parameters determined by the type of the device;
j) loading the virtual image into the memory of the computer system; and
k) copying the virtual image, sector by sector, onto the storage device.

6. Apparatus for storing and retrieving any state of a computer system having at least one primary data source, which state has occurred within a time period between a point in time at which the computer system contains at least one of a program and data in an initial state and some later point in time and during the time period data is transferred from the prior data source and such transfer changes the state of the system, comprising:
1) processing means;
2) memory means associated with the processing means for transient storage of data, containing software during the operation of the apparatus, the software being capable of directing the apparatus to:
  a) establish a base image corresponding to the initial state of the computer system;
  b) store the base image on at least one storage device;
  c) monitor changes to the state of the system;
  d) store the changes to the state of the system on the at least one storage device;
  e) map locations of the stored changes in an address table to enable subsequent retrieval of selected changes; and
  f) create, at a selected time when the address table becomes full, subsequent to the establishment of the base image, at least one differential image of the state of the system, by compiling all changes to the base image which occurred between creation of the base image and the selected time;
3) means for data communication between the primary data source and the processing means to enable the processing means to detect and record changes to the state of the system in the memory means; and 4) at least one storage device connected to the processing means for maintaining a record of the incremental changes to the primary data source.

7. An apparatus as described in claim 6, wherein the software is also capable of directing the apparatus to compile a virtual image of the storage device, as such data existed at a preselected point in time, whereby the virtual image comprises the base image, altered by selected stored changes, as directed by the address table.

8. An apparatus as described in claim 6, wherein the computer system is a personal computer.

9. An apparatus as described in claim 6, wherein the computer system is a network file server.

10. An apparatus as described in claim 6, wherein the primary data source is a magnetically read hard disk.

11. An apparatus as described in claim 6, wherein the changes to the state of the system are write actions to a hard disk.

12. An apparatus as described in claim 6, wherein the storage device is a magnetically read hard disk.

13. An apparatus as described in claim 6, wherein the storage device is an optically read disk.

14. An apparatus as described in claim 6, further comprising a secondary storage device connected to the processing means.

15. An apparatus as described in claim 14, wherein data from the primary data source is mirrored onto the secondary storage device.

16. An apparatus as described in claim 6, wherein the means for data communication between the processor and the primary data source is an SCSI-type link.

17. An apparatus as described in claim 6, wherein the means for data communication between the processor and the primary data source is a DMA-type link.

18. A method for storing and retrieving any prior state of a primary data storage device comprising the steps of:
   a) establishing a base image copy of the primary data storage device;
   b) storing the base image copy on a secondary storage device;
   c) monitoring changes to the primary data storage device;
   d) storing the changes to the primary data storage device on a secondary storage device;
   e) mapping locations of the stored changes in an address table to enable subsequent retrieval of any selected changes; and
   f) creating, at a selected time when the address table becomes full, subsequent to the establishment of the base image, at least one differential image of the state of the system, by compiling all changes to the base image which occurred between creation of the base image and the selected time.

19. A method as described in claim 18, further comprising the step of compiling a virtual image of data stored on the secondary storage device, as such data existed at a preselected prior point in time, wherein the virtual image comprises the base image copy altered by selected stored changes, as directed by the address table.

* * * * *

UNITED STATES PATENT AND TRADEMARK OFFICE
CERTIFICATE OF CORRECTION

PATENT NO.  :   5,089,958
DATED       :   February 18, 1992
INVENTOR(S) :   JAMES A. HORTON, STEPHEN M. GETZ It is certified that error appears in the above-identified patent and that said Letters Patent is hereby corrected as shown below:

Column 3, line 2, change "ay" to --may--.

Column 3, line 55, after "occurred" delete "0".

Signed and Sealed this

Twenty-ninth Day of June, 1993

Attest:

MICHAEL K. KIRK

Attesting Officer    Acting Commissioner of Patents and Trademarks